(12) United States Patent
Feichtinger et al.

(10) Patent No.: US 12,736,571 B2
(45) Date of Patent: Sep. 15, 2026

(54) NEAR-FIELD COMMUNICATION SYSTEMS AND METHODS FOR REDUCING BEAT FREQUENCY SIGNALS IN THE NEAR-FIELD COMMUNICATION SYSTEMS

(71) Applicant: NXP B.V., Eindhoven (NL)

(72) Inventors: Mark Feichtinger, Graz (AT); Wolfgang Hrauda, Gratwein (AT); Ulrich Andreas Muehlmann, Graz (AT)

(73) Assignee: NXP B.V., Austin, TX (US)

( * ) Notice: Subject to any disclaimer, the term of this patent is extended or adjusted under 35 U.S.C. 154(b) by 160 days.

(21) Appl. No.: 18/764,565

(22) Filed: Jul. 5, 2024

(65) Prior Publication Data

US 2026/0009836 A1 Jan. 8, 2026

(51) Int. Cl.
*G01R 29/08* (2006.01)
*H04B 5/24* (2024.01)
*H04B 5/43* (2024.01)

(52) U.S. Cl.
CPC ..... *G01R 29/0892* (2013.01); *G01R 29/0878* (2013.01); *H04B 5/24* (2024.01); *H04B 5/43* (2024.01)

(58) Field of Classification Search
CPC .. G01R 29/0892; G01R 29/0878; H04B 5/43; H04B 5/24
See application file for complete search history.

(56) References Cited

U.S. PATENT DOCUMENTS

| | | | | |
|---|---|---|---|---|
| 7,304,579 | B2 * | 12/2007 | Diorio | G06K 19/0723 340/572.1 |
| 10,585,169 | B2 | 3/2020 | Higuchi et al. | |
| 2007/0206701 | A1 * | 9/2007 | Paley | H04B 1/30 340/572.1 |
| 2008/0238622 | A1 * | 10/2008 | Rofougaran | H04B 5/22 375/371 |
| 2010/0190436 | A1 * | 7/2010 | Cook | H04B 5/266 455/41.1 |
| 2012/0229207 | A1 | 9/2012 | Huang et al. | |
| 2013/0231923 | A1 * | 9/2013 | Zakarauskas | G10L 21/0208 704/205 |
| 2021/0067163 | A1 * | 3/2021 | Karandikar | H03L 7/085 |
| 2021/0264891 | A1 | 8/2021 | Aval et al. | |
| 2022/0399640 | A1 * | 12/2022 | Jamin | H01Q 3/267 |

OTHER PUBLICATIONS

Wu, J. K. et al. "Estimation of Frequency, Amplitude and Phase of Sinusoidal Signals", IEEE, 2004, p. 353-356.
Jiang, Xiaodong et al. "Parameter Estimation for Sinusoidal Frequency-Modulated Signals Using Phase Modulation", IEEE Signal Processing Letters, vol. 28, 2021, pp. 76-80.
Yang, Cui et al. "Sinusoidal parameters estimation in speech sinusoidal model," 2009 International Conference on Machine Learning and Cybernetics, Baoding, China, 2009, pp. 3633-3638.

* cited by examiner

*Primary Examiner* — Sisay Yacob

(57) ABSTRACT

A reader of a communication system and method uses a synthesized control signal to cancel a beat frequency signal of an incoming signal, where the beat frequency signal is due to a magnetic coupling of the reader with another reader. The control signal is synthesized using at least one parameter of the beat frequency signal, which is estimated based on the incoming signal.

20 Claims, 11 Drawing Sheets

NEAR-FIELD COMMUNICATION SYSTEMS AND METHODS FOR REDUCING BEAT FREQUENCY SIGNALS IN THE NEAR-FIELD COMMUNICATION SYSTEMS

BACKGROUND

In near-field communication (NFC) systems, a proximity coupling device (PCD), i.e., a reader or wireless charging device, is magnetically coupled with a proximity integrated circuit card (PICC), i.e., a tag or energy receiving device. The PCD and the PICC exchange information by modulating a radio frequency (RF) carrier signal emitted by the PCD. However, when two or more PCDs are in close proximity to each other, the PCDs may also get magnetically coupled, which may cause a communication failure.

SUMMARY

A reader of a communication system and method uses a synthesized control signal to cancel a beat frequency signal of an incoming signal, where the beat frequency signal is due to a magnetic coupling of the reader with another reader. The control signal is synthesized using at least one parameter of the beat frequency signal, which is estimated based on the incoming signal.

In an embodiment, a reader of a communication system comprises an antenna to receive an incoming signal, wherein the incoming signal includes a beat frequency signal due to a magnetic coupling of the reader with another reader, a sinusoidal estimator operably connected to the antenna, the sinusoidal estimator being configured to estimate at least one parameter of the beat frequency signal based on the incoming signal, at least one signal synthesizer coupled to the sinusoidal estimator, the at least one signal synthesizer being configured to synthesize a control signal using the at least one parameter of the beat frequency signal, and at least one adder circuit operably connected to the antenna and the at least one signal synthesizer to subtract a signal portion from the incoming signal based on the control signal to cancel the beat frequency signal of the incoming signal.

In an embodiment, the reader further comprises at least one analog-to-digital converter operably coupled to the antenna, wherein the at least one analog-to-digital converter is configured to convert the incoming signal to a digital signal and wherein the sinusoidal estimator is configured to estimate a phase of the beat frequency signal based on the digital signal.

In an embodiment, the reader further comprises a rectifier operably coupled to the antenna, wherein the rectifier is configured to rectify the incoming signal into a rectified signal, wherein the sinusoidal estimator is configured to estimate amplitude and frequency of the beat frequency signal based on the rectified signal.

In an embodiment, the reader further comprises at least one low-pass filter between the rectifier and the sinusoidal estimator.

In an embodiment, the reader further comprises at least one second adder circuit connected to the at least one signal synthesizer to add the control signal with one or more outputs from an operation point tracking module.

In an embodiment, the reader further comprises at least one digital-to-analog converter operably connected to the at least one second adder circuit to convert a signal from the at least one second adder circuit to an analog signal, wherein the at least one digital-to-analog converter is connected to the at least one adder circuit to provide the analog signal to the at least one adder circuit.

In an embodiment, the at least one signal synthesizer includes a single signal synthesizer that is used for both in-phase (I) and quadrature (Q) channels.

In an embodiment, a method comprises receiving an incoming signal at a reader of a communication system, wherein the incoming signal includes a beat frequency signal due to a magnetic coupling of the reader with another reader, estimating at least one parameter of the beat frequency signal based on the incoming signal, synthesizing a control signal using the at least one parameter of the beat frequency signal, and subtracting a signal portion from the incoming signal based on the control signal to cancel the beat frequency signal of the incoming signal.

In an embodiment, the method further comprises converting the incoming signal to a digital signal, wherein a phase of the beat frequency signal is estimated based on the digital signal.

In an embodiment, the method further comprises rectifying the incoming signal into a rectified signal, wherein amplitude and frequency of the beat frequency signal are estimated based on the rectified signal.

In an embodiment, the method further comprises applying at least one low-pass filter on the rectified signal.

In an embodiment, the method further comprises adding the control signal with one or more outputs from an operation point tracking module.

In an embodiment, the method further comprises converting a signal derived from adding the control signal with the one or more outputs from the operation point tracking module into an analog signal, wherein the analog signal is used to subtract the signal portion from the incoming signal.

In an embodiment, the control signal includes a control signal for an in-phase (I) channel and a control signal for a quadrature (Q) channel that are generated by a single signal synthesizer.

In an embodiment, a reader of a communication system comprises an antenna to receive an incoming signal, wherein the incoming signal includes a beat frequency signal due to a magnetic coupling of the reader with another reader, a matching circuit connected to the antenna, wherein the matching circuit being configured to provide impedance matching, a sinusoidal estimator operably connected to the matching circuit, the sinusoidal estimator being configured to estimate at least one parameter of the beat frequency signal based on the incoming signal, at least one signal synthesizer coupled to the sinusoidal estimator, the at least one signal synthesizer being configured to synthesize a control signal using the at least one parameter of the beat frequency signal, at least one adder circuit operably connected to the matching circuit and the at least one signal synthesizer to subtract a signal portion from the incoming signal based on the control signal to cancel the beat frequency signal of the incoming signal, and at least one analog-to-digital converter operably connected to the at least one adder circuit, the at least one analog-to-digital converter being configured to convert a resulting signal from the at least one adder circuit into a digital signal, wherein the digital signal represents the incoming signal.

In an embodiment, the sinusoidal estimator is configured to estimate a phase of the beat frequency signal based on the digital signal.

In an embodiment, the reader further comprises a rectifier operably coupled to the matching circuit, wherein the rectifier is configured to rectify the incoming signal into a rectified signal, wherein the sinusoidal estimator is configured to estimate amplitude and frequency of the beat frequency signal based on the rectified signal.

In an embodiment, the reader further comprises at least one low-pass filter between the rectifier and the sinusoidal estimator.

In an embodiment, the reader further comprises at least one second adder circuit connected to the at least one signal synthesizer to add the control signal with one or more outputs from an operation point tracking module.

In an embodiment, the reader further comprises at least one digital-to-analog converter operably connected to the at least one second adder circuit to convert a signal from the at least one second adder circuit to an analog signal, wherein the at least one digital-to-analog converter is connected to the at least one adder circuit to provide the analog signal to the at least one adder circuit.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

Figure 1:
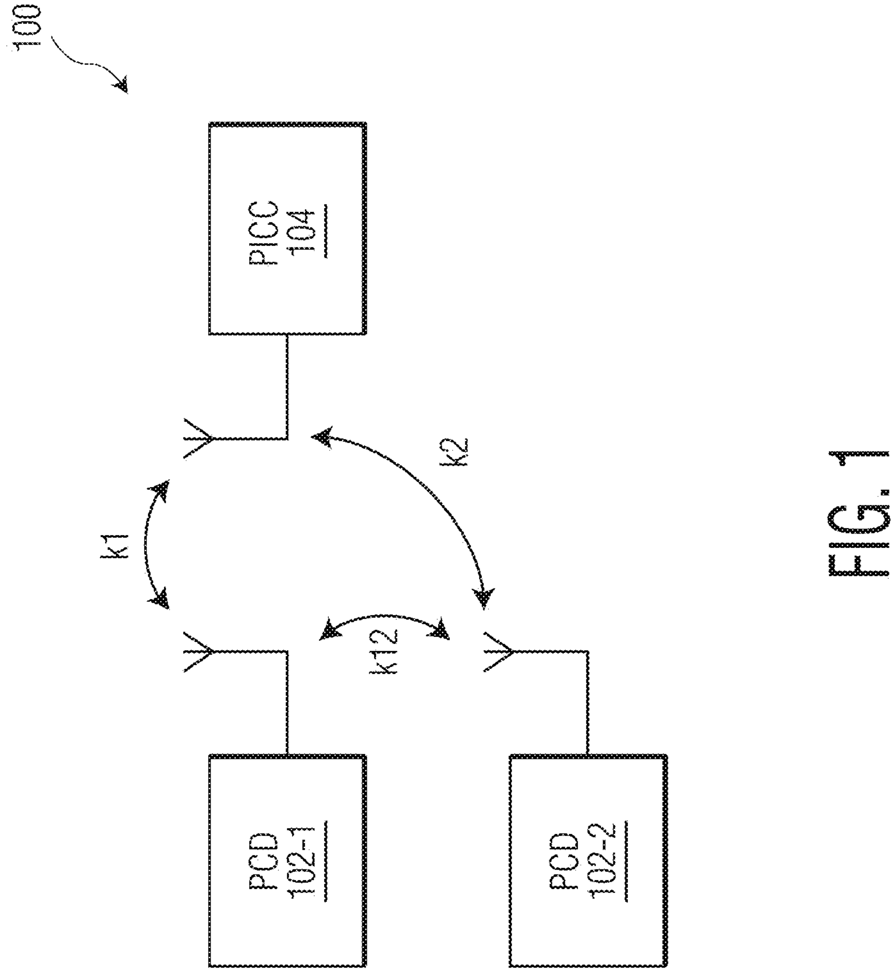
FIG. 1 is a diagram of a near-field communication (NFC) system that includes two proximity coupling devices (PCDs) and a proximity integrated circuit card (PICC) in accordance with an embodiment of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As used herein, the term "coupled" or "connected" includes directly coupled or directly connected so that one element is directly coupled or connected to another element, and indirectly coupled or indirectly connected so that one element is indirectly coupled or connected to another element, i.e., one or more elements may be present between the coupled or connected elements.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Turning now to FIG. 1, a near-field communication (NFC) system 100 in accordance with an embodiment of the invention is shown. The NFC system may include any number of proximity coupling devices (PCDs), i.e., reader or wireless charging devices that can be magnetically coupled with one or more proximity integrated circuit cards (PICCs), i.e., tags or energy receiving devices. However, in FIG. 1, the NFC system is shown with only two PCDs 102-1 and 102-2, and a single PICC 104 to describe the inventive features of the invention more clearly.

In the illustrated embodiment, the PCD 102-1 and the PICC 104 are magnetically coupled to exchange information using a radio frequency (RF) carrier signal emitted by the PCD 102-1. However, the PCD 102-1 is in close proximity with the PCD 102-2, and thus, the PCD 102-2 is also magnetically coupled to the PCD 102-1, which is expecting communication from the PICC 104. If the two PCDs are well enough coupled, the carrier signals emitted by the two PCDs will superimpose.

In ISO 14443, the carrier frequency is defined as 13.56 Megahertz (MHz)+/−7 kilohertz (kHz). This means that different PCDs can run at slightly different carrier frequencies but still satisfy the standard. However, due to this carrier frequency deviations between the PCDs, a beat frequency effect may be observed on the receiver input signal of both PCDs. The problem occurs when two PCDs are close together in proximity and are well magnetically coupled.

Figure 2A:
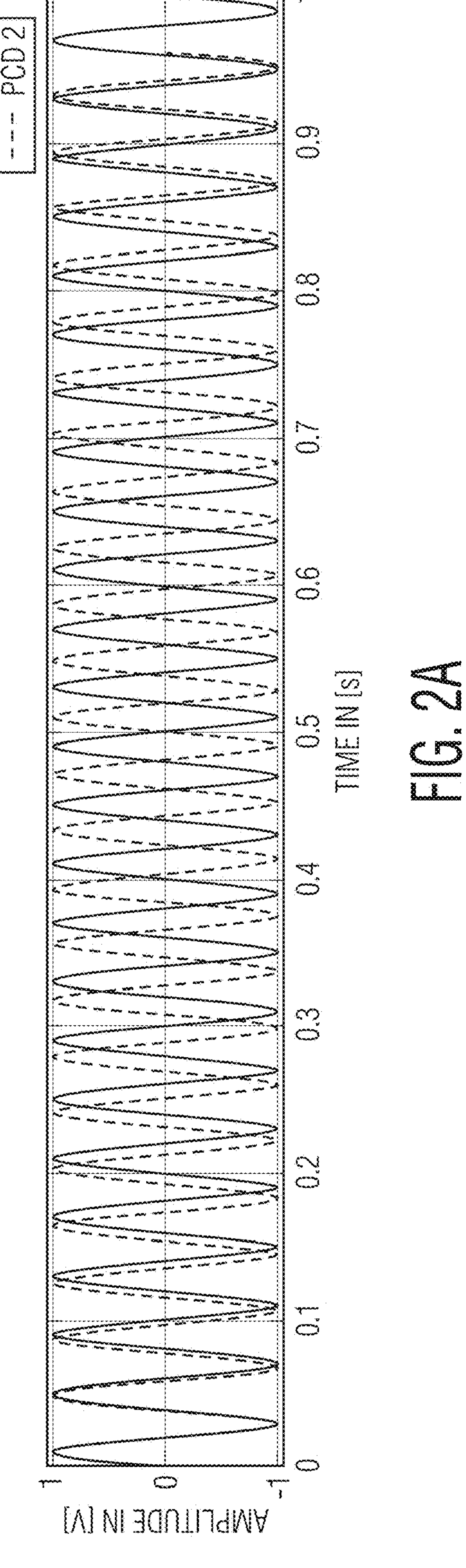
FIG. 2A shows the superposition of two radio frequency (RF) carrier signals from two PCDs of the NFC system with slightly different carrier frequencies in accordance with an embodiment of the invention.
Figure 2B:
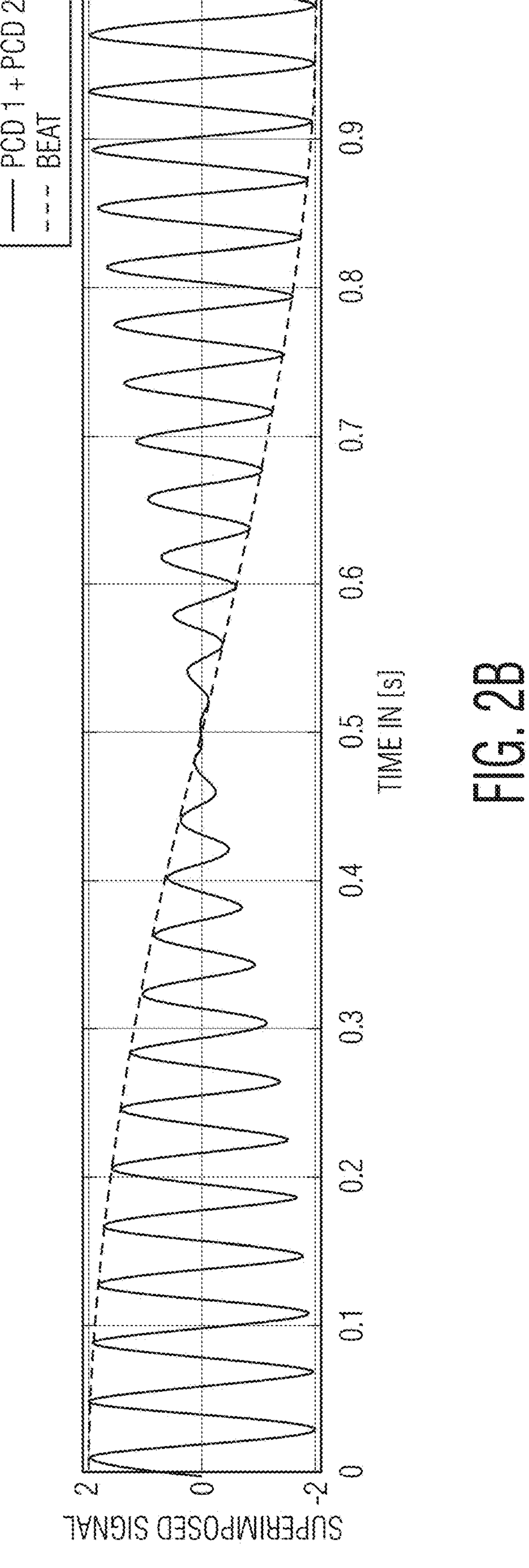
FIG. 2B shows the superimposed signal resulting from the two RF carrier signals from two proximity coupling devices (PCDs) of the NFC system, which creates a beat frequency.

As an example, let's assume that the PCD 102-1, which is placed close to the PCD 102-2, has an ideal clock and transmits an RF carrier signal k1 exactly at a predefined frequency, e.g., exactly at 13.56 MHz. However, let's also assume that the PCD 102-2 has a clock which runs at a slightly different speed and transmits an RF carrier signal k2 at a frequency that is equal to the predefined frequency plus or minus an offset (e.g. 1 kHz). The second RF carrier signal k2, which is emitted from the PCD 102-2, will be superimposed at the antenna of the PCD 102-1 with an amplitude which depends on the coupling factor k12 between the two PCDs, as illustrated in FIG. 1. Usually, the amplitude of the superimposed second RF carrier signal k2 will be significantly less than the amplitude of the first RF carrier signal k1. The superposition of two sine waves at slightly different frequencies is known to lead to a beat frequency effect which can be observed in the time-domain as a slow periodic amplitude modulation, as illustrated in FIGS. 2A and 2B. In a similar manner, the PCD 102-2 will also suffer from the beat frequency effect as well.

FIGS. 2A and 2B show the superposition of two RF signals from the two PCDs 102-1 and 102-2 with slightly different carrier frequencies, which leads to a beat frequency. In the case of a constant frequency offset between the two superimposed RF carrier signals, the corresponding baseband signals to be cancelled have sinusoidal shape. FIG. 2A shows the carrier signals from the PCD 102-1 ("PCD 1") and the PCD 102-2 ("PCD 2") with different frequencies. FIG. 2B shows the superimposed signal resulting from the two carrier signals, which creates a beat frequency.

The NFC PCD assumes a constant RF signal or a very slow RF amplitude changes which can be covered using state-of-the-art operation point tracking methods. However, saturation may happen in the baseband signal after the mixer.

The bottleneck in terms of dynamic range of a state-of-the-art receiver chain for an NFC PCD are the analog-to-digital converters (ADCs). As an example, the ADCs might be designed to convert baseband signals to the digital domain using ten (10) bits within a dynamic range of +/−0.3V. Due to area and power optimizations in an integrated circuit (IC), it may not be possible to simply increase the dynamic range to cover the additional range due to the beat or to increase the resolution of the ADC. Hence, the regulation would need to find an operation point which keeps the whole received signal, including the beat, in the dynamic range of the ADC. However, this would limit the sensitivity, as the resolution of the ADC is limited.

Although most state-of-the-art NFC PCDs use digital-to-analog converters (DACs) to remove constant DC offsets from the baseband signals after the RF I/Q mixer, such mechanisms have high resolution at the cost of limited speed, usually limited by the control loop to avoid oscillations. This speed limitation is especially true while the PCD is receiving a frame from the PICC in the presence of a strong narrow-band interferer, as slow regulation will limit the reception.

In accordance with embodiments of the invention, the PCD 102-1 is designed to cancel out the beat frequency. Hence, no optimized regulation to cover the beat is required and the receiver chain can settle to an optimal operation point without considering the beat. As described in more detail below, the PCD 102-1 utilizes the existing baseband DC offset cancellation. The cancellation is achieved by synthesizing appropriate control signals for the baseband DC offset cancelation. This appropriate control signals create a signal which cancels out the beat frequency and recovers the dynamic range of the receiver.

In an embodiment, the PCD 102-1 implements a mixed signal concept using a single DAC to compensate for operational point tracking (i.e., compensate low speed variations originated by movement and dynamic coupling variations) and beat frequency cancelation (i.e., compensate PCD proximity interference, sine wave, narrow band). The beat frequency cancellation is achieved by first estimating the parameters of the sinusoidal beat signal from the received RF signal and ADC I/Q output: Amplitude A, frequency f and phase φ. This parameter estimation may be performed when no modulation from the PCD 102-1 or PICC 104 is present. An appropriate control signal is then synthesized for the baseband DC offset cancellation using the sinusoidal signal parameters: amplitude A, frequency f and phase q. The synthesized control signal is converted into an analog voltage by the DACs, which is subtracted from the mixer output signal and cancels out the beat signal.

Figure 3A:
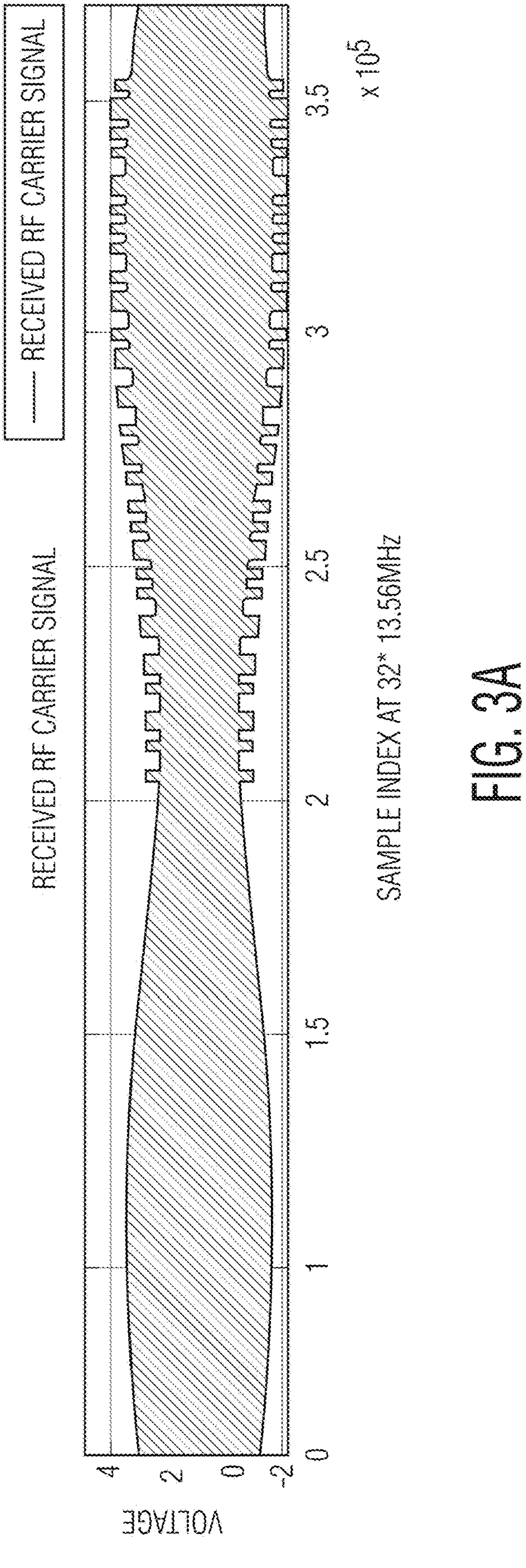
FIG. 3A shows the received RF signal at a PCD of the NFC system, which includes a beat frequency, in accordance with an embodiment of the invention.
Figure 3B:
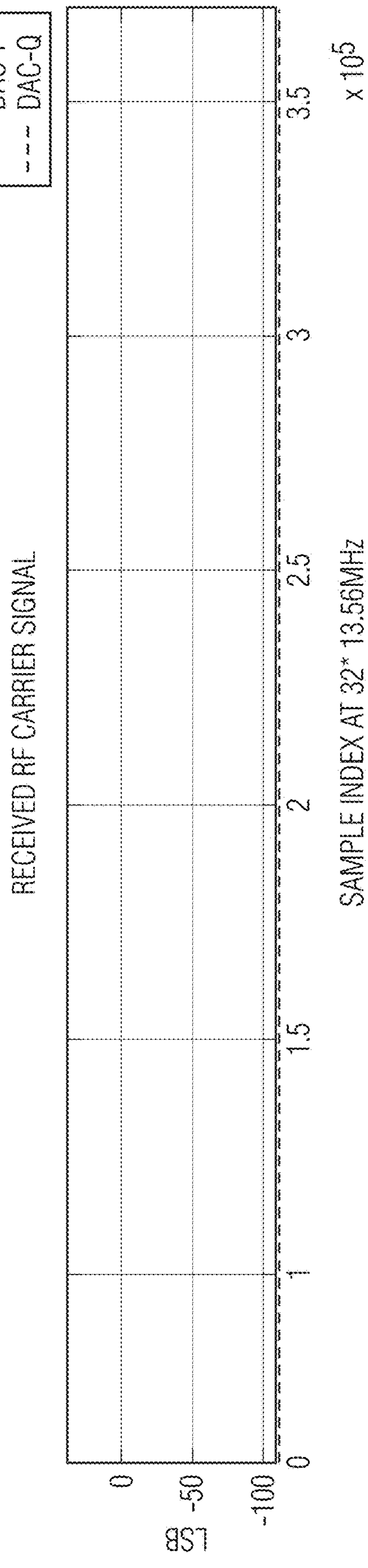
FIG. 3B shows constant digital-to-analog converter (DAC) values in the PCD due to other state-of-the-art tracking mechanism being disabled.
Figure 3C:
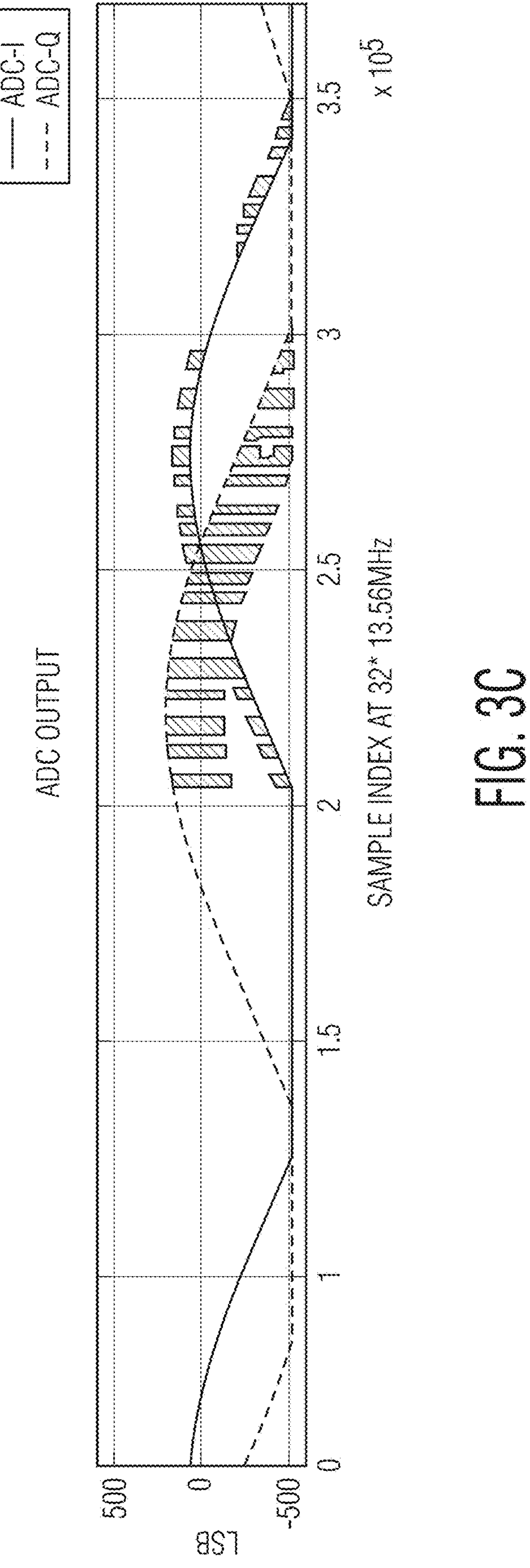
FIG. 3C shows the beat frequency moving analog-to-digital converter (ADC) output out of the ADC's dynamic range.

FIGS. 3A-3C illustrate the impact on the ADC output signals for a received RF signal that includes the beat frequency using a simulation. FIG. 3A shows the received RF signal that includes the beat frequency. For this simulation, all other state-of-the-art tracking mechanism were disabled as well which is indicated by the constant DAC values in FIG. 3B. As shown FIG. 3C, the beat moves the ADC output signal out of the ADC's dynamic range. Hence, the communication will fail. A possibility to keep the ADC signal within the dynamic range is to decrease the received signal strength by lowering the gain. However, this would lead to a lower sensitivity what is not desired. Consequently, cancelling out the beat signal is desired.

Figure 4:
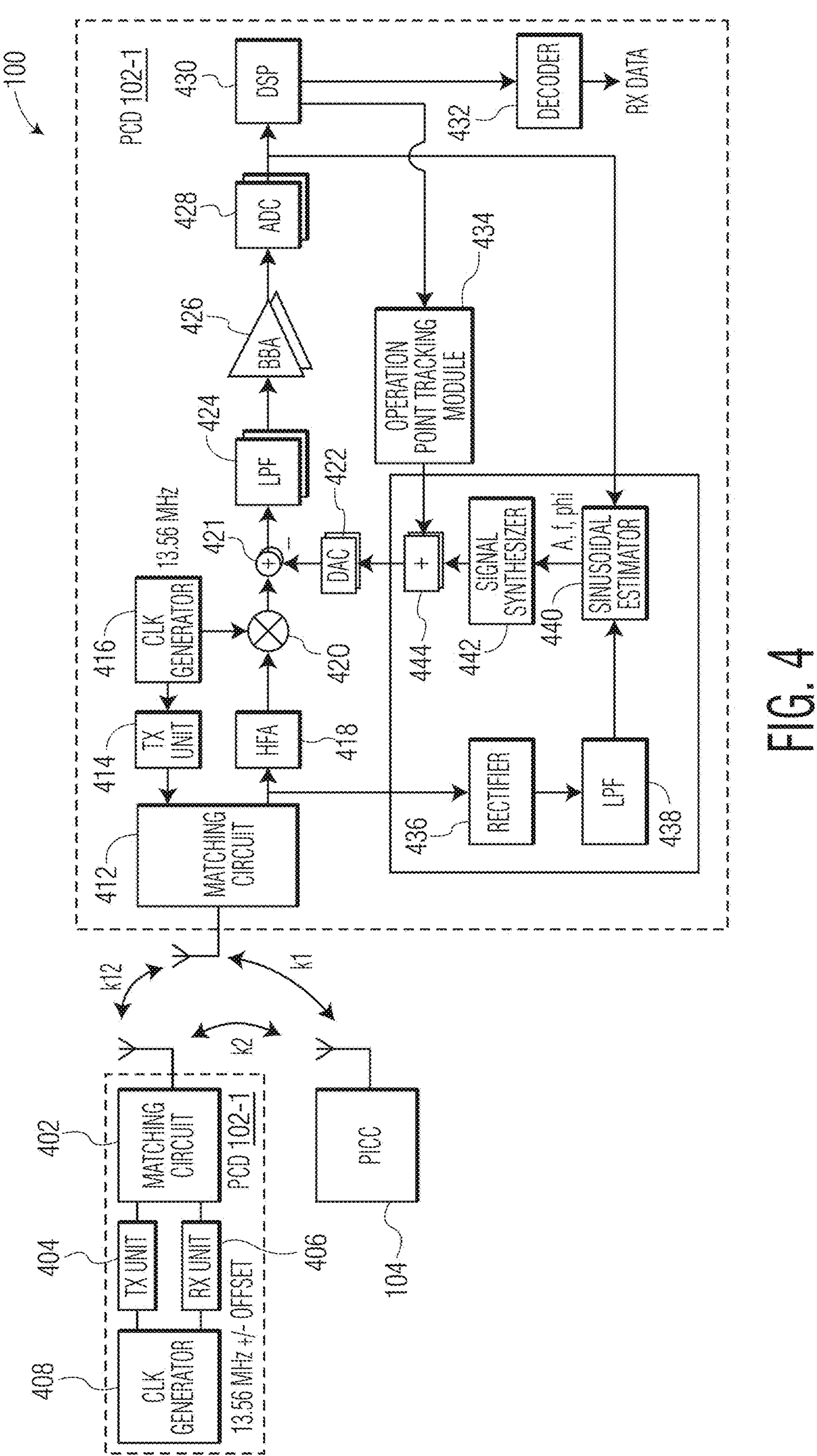
FIG. 4 is a more detailed diagram of the PCDs of the NFC system in accordance with an embodiment of the invention.

FIG. 4 is a more detailed diagram of the PCD 102-1 and PCD 102-2 of the NFC system 100 in accordance with an embodiment of the invention. The PCD 102-2 is shown with components that are relevant to describe various aspects of the invention. As shown in FIG. 4, the PCD 102-2 includes a matching circuit 402, a transmit (TX) unit 404, a receive (RX) unit 406, and a clock generator 408, which generates a clock signal with frequency of 13.56 MHz+/−offset. The transmit unit 404 may include well-known components that process data for transmission using the clock signal from the clock generator 408 via the matching circuit 402, which provides impedance matching.

The PCD 102-1 also includes a matching circuit 412, a transmit (TX) unit 414, and a clock generator 416, which generates a clock signal with frequency of 13.56 MHz. Similar to the transmit unit 404 of the PCD 102-2, the transmit unit 414 may also include well-known components that process data for transmission using the clock signal from the clock generator 416 via the matching circuit 412, which provides impedance matching for the PCD 102-1.

The PCD 102-1 also includes a high frequency attenuator (HFA) 418, a mixer 420, adding circuits 421, digital-to-analog converters (DACs) 422, low-pass filters (LPFs) 424, baseband amplifiers (BBAs) 426, analog-to-digital converters (ADCs) 428, a digital signal processor (DSP) 430, a decoder 432 and an operation point tracking module 434. The HFA 418 provides variable attenuation to the incoming high frequency received signal to fit it to the dynamic range of the receiver. The mixer 420 mixes the signal down to a lower frequency region usually referred to as the baseband, and sent to the adder circuits 421 for baseband DC offset cancellation. The resulting signal is then sent through the LPFs 424 and to the BBAs 426, which amplify the signal. The received signal is converted to a digital signal by the ADCs 428 and sent to the digital signal processor 430, which can be any type of a processor. The received signal can then be sent from the digital signal processor 430 to the decoder 432 to decoder the signal. The received signal can also be sent from the digital signal processor 430 to the operation point tracking module 434, which operates to compensate low speed variations in the received signal originated by movement and dynamic coupling variations in both the in-phase (I) and the quadrature (Q) channels. The operation point tracking module 434 may be implemented as a circuit or a digital module or process executed by the DSP 430. The output of the operation point tracking module 434 includes a digital signal for each of the I and Q channels which is converted to an analog signal by the DACs 422. This analog signal is then subtracted from the signal after the mixer 420 by the adder circuits 421 to remove residual DC offset. Thus, a signal portion of the incoming signal is removed or subtracted to cancel the beat signal contained in the original incoming signal.

The PCD 102-1 further includes a rectifier 436, an LPF 438, a sinusoidal estimator 440, a signal synthesizer 442 and adder circuits 444. The rectifier 436 operates to rectify the received analog signal from the matching circuit 412 and output the rectified signal through the LPF 438. The sinusoidal estimator 440 generates the sinusoidal signal parameters (A, f and φ) for the signal synthesizer 442 to synthesize the control signal for the baseband DC offset cancellation, which is combined in the adder circuits 444 with the outputs of the operation point tracking module 434. The combined signal is then converted to an analog signal by the DACs 422, which is subtracted from the mixer output signal by the adder circuits 421. Thus, the beat signal is canceled out.

Each of the adding circuits 421, the DACs 422, the LPFs 424, the BBAs 426, the ADCs 428 and the adder circuits 444 operates on either the I channel or the Q channel. Thus, in the illustrated embodiment, there are pairs of these components.

In operation, an RF carrier signal using the clock signal (CLK) from the clock generator 416 at the ideal reference frequency of 13.56 MHz is generated by the PCD 102-1. Due to magnetic coupling (k12) between the PCD 102-1 and the PCD 102-2, the RF signal from the PCD 102-1 is superimposed with the RF carrier signal from the PCD 102-2, which uses its own clock (CLK) from the clock generator 408 at a frequency of 13.56 MHz plus/minus an arbitrary but stable offset in the operating window. Slow changes of this offset can be handled by state-of-the-art tracking mechanisms once the beat frequency is canceled out. The resulting beat frequency itself is defined to be that offset, as shown in the following equation:

$$f_{beat} = f_1 - f_2 = f_c - f_c + f_{offset} = f_{offset} \tag{1}$$

For beat frequency cancellation, the input parameters (A, f, φ) of the signal synthesizer 442 need to be estimated from the received RF carrier signal and/or any other signal observation point in the receiver system of the PCD 102-1. As an example, the amplitude A of the beat frequency signal can be estimated using a rectifier and low-pass filters, e.g., the rectifier 436 and the low-pass filter 438. The frequency f of the beat frequency signal can be estimated using zero crossing counters or Fourier coefficients. The phase φ of the beat frequency signal can be estimated using a reference signal and measuring the time between the two zero crossings or Fourier coefficients. However, there may be other ways to estimate these input parameters (A, f, φ) of the signal synthesizer 442. In the embodiment illustrated in FIG. 4, the ADC I/Q output is chosen to estimate the phase φ of the beat frequency. It is noted here that if the phase φ is to be estimated from the RF signal, one needs to take the sampling frequency of the mixer 420 into account. To estimate the amplitude A and frequency f, the envelope of the RF carrier signal or the related baseband signals can be used to feed an arbitrary suitable known sinusoidal parameter estimation algorithm.

The parameter estimation requires a dedicated receiver configuration. To maximise the observation range at the ADC outputs, a low gain configuration may be required. Additionally, the parameter estimation may be performed during the so-called RF guard time. The RF guard time is the initial lead time between enabling RF carrier transmission by the PCD 102-1 and sending the first PCD request command. In general, the RF guard time is 5 ms. Hence, the parameter estimation will have a lower frequency bound depending on the length of the used observation window. The lower bound for the parameter estimation to identify the beat frequency is defined by the RF guard time and is 200 Hz when the RF guard time is 5 ms, as shown in the following equation:

$$f_{lower} = \frac{1}{T_{gaurd}} = \frac{1}{5\text{ ms}} = 200\text{ Hz} \tag{2}$$

For this scenario, this means that the beat frequencies lower than 200 Hz cannot be estimated reliably. In such cases, the low frequency operation point tracking mechanism (i.e., the operation point tracking module 434) will be used and the signal synthesizer 442 may be switched off. Finally, the actually supported frequency range also varies with the used estimation algorithm, e.g., special algorithms might be used to estimate parameters of low frequency sine waves despite a relatively short observation window. However, there is a mechanism that determines the quality of the estimated parameters. In case the cancellation is not reliable, the estimation algorithm may be switched off and the low frequency operation point tracking may be used.

Once the sinusoidal parameters are estimated by the sinusoidal estimator 440, the signal synthesizer 442 or at least a counter (not shown) should be kept running throughout PCD request, response of the PICC 104 and the frame delay time in between, to make sure the phase of the synthesized signal is not deviating from the original estimation. Any residual errors in the cancellation due to non-optimal estimation, slight variations over time etc. may be compensated by running state-of-the-art reactive tracking mechanisms for the offset compensation DACs 422 on top of the synthesized DAC control signals.

Figure 5A:
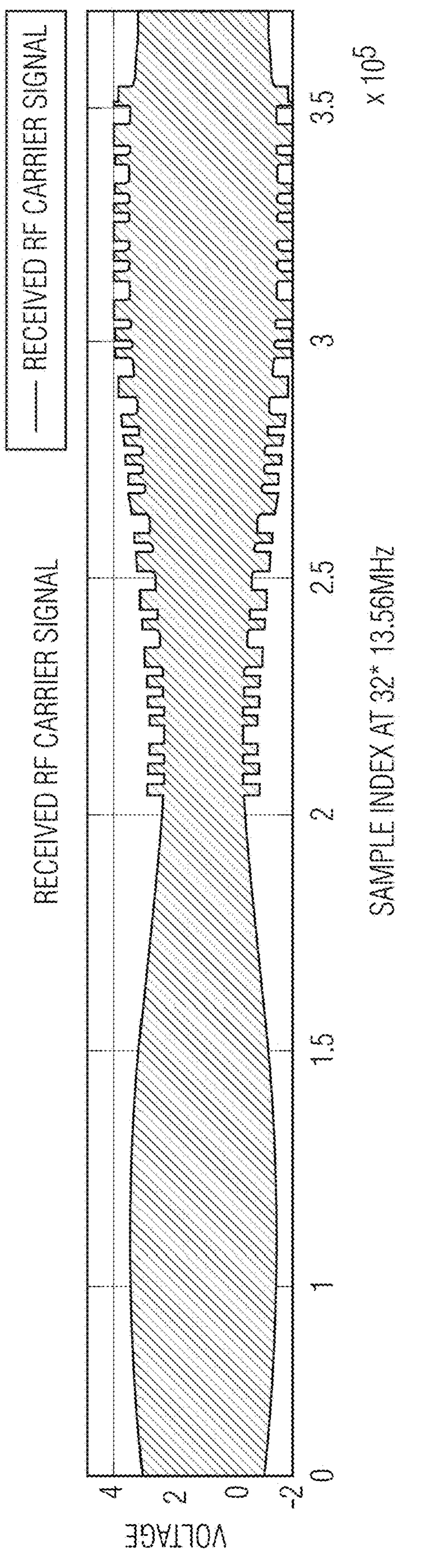
FIG. 5A shows the received RF signal at a PCD of the NFC system, which includes a beat frequency, in accordance with an embodiment of the invention.
Figure 5B:
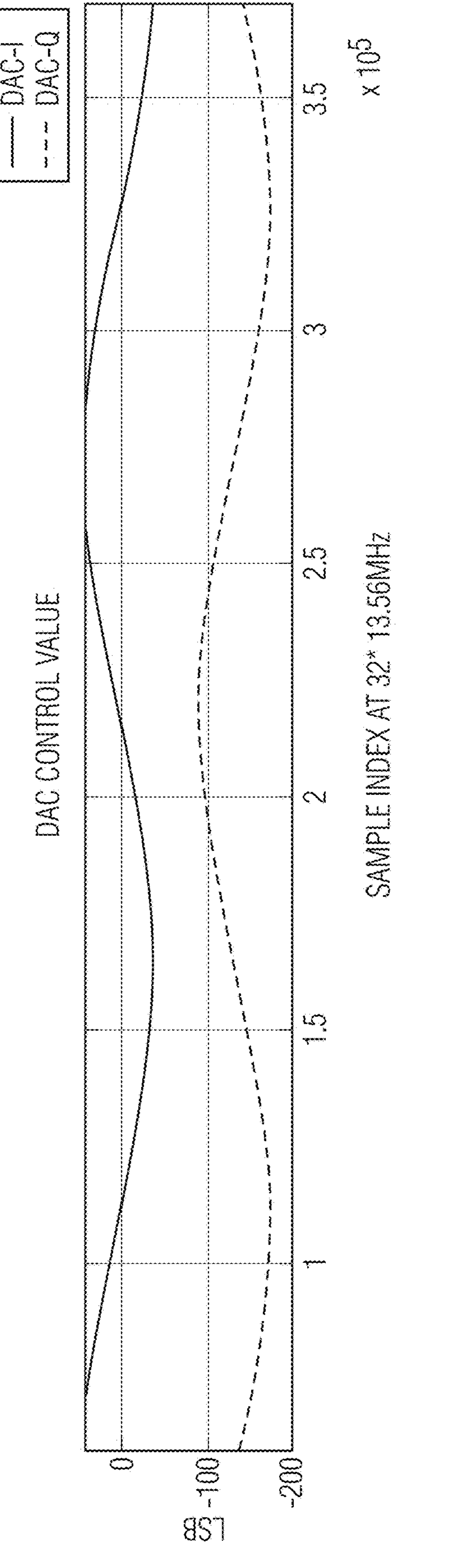
FIG. 5B shows sinusoidal shaped DAC values in the PCD in accordance with an embodiment of the invention.
Figure 5C:
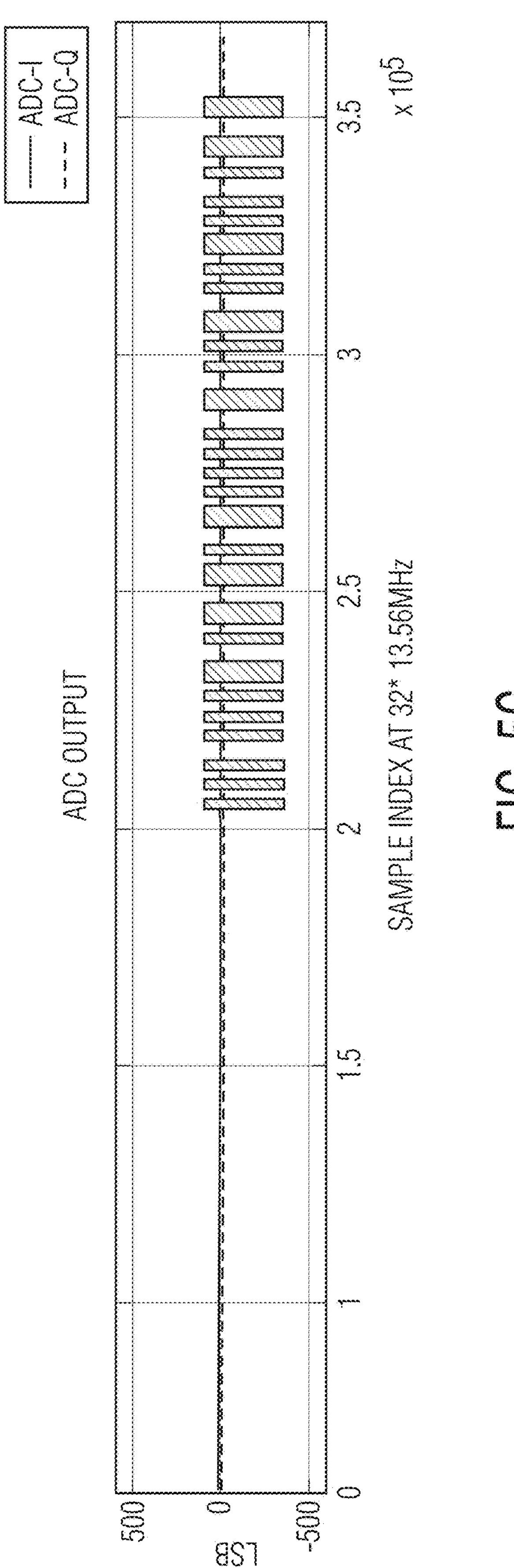
FIG. 5C shows that synthesized signals are successfully canceling out the beat frequency at the ADC output in accordance with an embodiment of the invention.

FIGS. 5A, 5B and 5C illustrate the impact of the synthesized signal on the ADC output in accordance with an embodiment of invention. The RF signal shown in FIG. 5A is the same signal as in FIG. 3A. However, the synthesized signals indicated by the sinusoidal shaped DAC indexes, as illustrated in FIG. 5B, are successfully cancelling out the beat signal at the ADC output, as illustrated in FIG. 5C.

In an embodiment, one signal synthesizer may be used for both in-phase (I) and quadrature (Q) channels. Thus, it is not necessary to implement two signal synthesizers, as this would double the implementation complexity. Assuming a static offset between the two carrier frequencies, the beat signal would be a sinusoidal signal. State-of-the-art PCDs use an I/Q mixer with 90° offset between the I and Q channels. Hence, the baseband signals and the corresponding cancellation signals can be viewed as a complex signal with a 90° phase relation. Due to the sinusoidal shape of the beat frequency signal in the baseband, the complex output of the signal synthesizer in a discrete-time implementation with sampling rate $f_s$ could be written as:

$$s[n] = A\cdot\left(\sin\left(2\pi\cdot\frac{f}{f_s}\cdot n+\varphi\right)+j\cdot\cos\left(2\pi\cdot\frac{f}{f_s}\cdot n+\varphi\right)\right), \quad (3)$$

where A, f and φ are the estimated sinusoidal signal parameters and j is the complex number (i.e., $j^2=-1$).

The cancellation signal used to control the I-Channel DAC would be Re{s[n]}, which is the real part of s[n], while the cancellation signal used to control the Q-channel DAC would be Im{s[n]}, which is the imaginary part of s[n]. In this case, the signal synthesizer only needs to be implemented once because the DAC control signals can be derived from each other by applying a simple 90° phase shift in the corresponding direction. The amplitude of the synthesized signal s[n] should be scaled and/or quantized to fit the actual system components behavior (e.g. resulting output step when increasing the DAC control value by one unit). Exemplary cancellation signals for the I and Q channel are shown in FIG. 5B. Once DAC output signals are subtracted from the I and Q channel baseband signals, respectively, the beat frequency effect should be compensated as shown in FIG. 5C.

Figure 6:
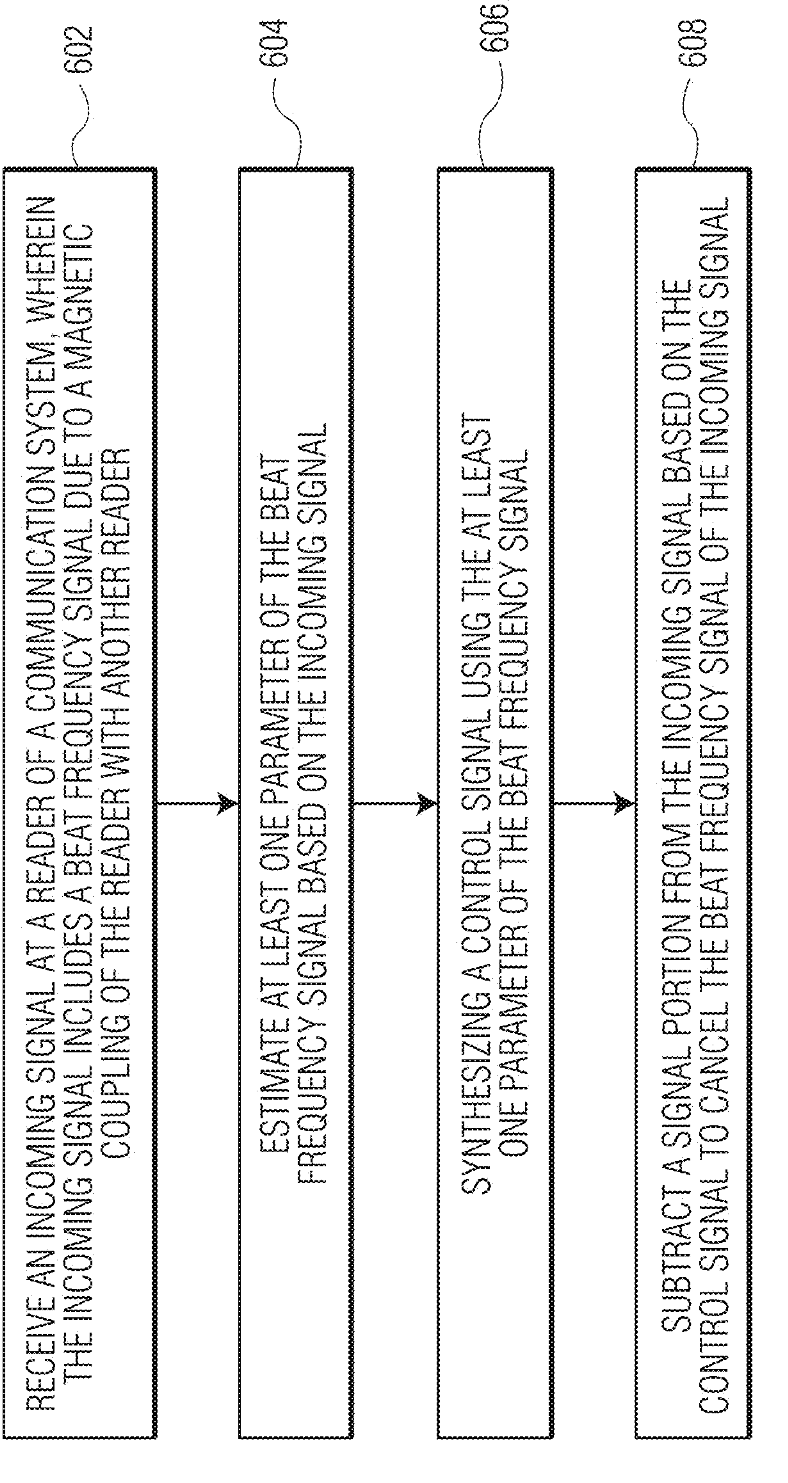
FIG. 6 is a process flow diagram of a method in accordance with an embodiment of the invention.

A method in accordance with an embodiment of the invention is described with reference to a process flow diagram of FIG. 6. At block 602, an incoming signal is received at a reader of a communication system. The incoming signal includes a beat frequency signal due to a magnetic coupling of the reader with another reader. At block 604, at least one parameter of the beat frequency signal is estimated based on the incoming signal. At block 606, a control signal is synthesized using the at least one parameter of the beat frequency signal. At block 608, a signal portion is subtracted from the incoming signal based on the control signal to cancel the beat frequency signal of the incoming signal. In an embodiment, the control signal is combined with one or more outputs from the operation point tracking module 434 and converted to an analog signal, which is then subtracted from the incoming signal to cancel the beat frequency signal of the incoming signal.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk.

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A reader of a communication system comprising:

an antenna to receive an incoming signal, wherein the incoming signal includes a beat frequency signal due to a magnetic coupling of the reader with another reader;

a sinusoidal estimator operably connected to the antenna, the sinusoidal estimator being configured to estimate a frequency and a phase of an external interference-related component of the beat frequency signal based on the incoming signal;

at least one signal synthesizer coupled to the sinusoidal estimator, the at least one signal synthesizer being configured to synthesize a control signal using the frequency and the phase of the beat frequency signal; and at least one adder circuit operably connected to the antenna and the at least one signal synthesizer to subtract a signal portion from the incoming signal based on the control signal to cancel the beat frequency signal of the incoming signal.

2. The reader of claim 1, further comprising at least one analog-to-digital converter operably coupled to the antenna, wherein the at least one analog-to-digital converter is configured to convert the incoming signal to a digital signal and wherein the sinusoidal estimator is configured to estimate a phase of the beat frequency signal based on the digital signal.

3. The reader of claim 1, further comprising a rectifier operably coupled to the antenna, wherein the rectifier is configured to rectify the incoming signal into a rectified signal, wherein the sinusoidal estimator is configured to estimate amplitude and frequency of the beat frequency signal based on the rectified signal.

4. The reader of claim 3, further comprising at least one low-pass filter between the rectifier and the sinusoidal estimator.

5. The reader of claim 1, further comprising at least one second adder circuit connected to the at least one signal synthesizer to add the control signal with one or more outputs from an operation point tracking module.

6. The reader of claim 5, further comprising at least one digital-to-analog converter operably connected to the at least one second adder circuit to convert a signal from the at least one second adder circuit to an analog signal, wherein the at least one digital-to-analog converter is connected to the at least one adder circuit to provide the analog signal to the at least one adder circuit.

7. The reader of claim 1, wherein the at least one signal synthesizer includes a single signal synthesizer that is used for both in-phase (I) and quadrature (Q) channels.

8. A method comprising:

receiving an incoming signal at a reader of a communication system, wherein the incoming signal includes a beat frequency signal due to a magnetic coupling of the reader with another reader;

estimating a frequency and a phase of an external interference-related component of the beat frequency signal based on the incoming signal;

synthesizing a control signal using the frequency and the phase of the beat frequency signal; and subtracting a signal portion from the incoming signal based on the control signal to cancel the beat frequency signal of the incoming signal.

9. The method of claim 8, further comprising converting the incoming signal to a digital signal, wherein a phase of the beat frequency signal is estimated based on the digital signal.

10. The method of claim 8, further comprising rectifying the incoming signal into a rectified signal, wherein amplitude and frequency of the beat frequency signal are estimated based on the rectified signal.

11. The method of claim 10, further comprising applying at least one low-pass filter on the rectified signal.

12. The method of claim 8, further comprising adding the control signal with one or more outputs from an operation point tracking module.

13. The method of claim 12, further comprising converting a signal derived from adding the control signal with the one or more outputs from the operation point tracking module into an analog signal, wherein the analog signal is used to subtract the signal portion from the incoming signal.

14. The method of claim 8, wherein the control signal includes a control signal for an in-phase (I) channel and a control signal for a quadrature (Q) channel that are generated by a single signal synthesizer.

15. A reader of a communication system comprising:

an antenna to receive an incoming signal, wherein the incoming signal includes a beat frequency signal due to a magnetic coupling of the reader with another reader;

a matching circuit connected to the antenna, wherein the matching circuit being configured to provide impedance matching;

a sinusoidal estimator operably connected to the matching circuit, the sinusoidal estimator being configured to estimate a frequency and a phase of an external interference-related component of the beat frequency signal based on the incoming signal;

at least one signal synthesizer coupled to the sinusoidal estimator, the at least one signal synthesizer being configured to synthesize a control signal using the frequency and the phase of the beat frequency signal;

at least one adder circuit operably connected to the matching circuit and the at least one signal synthesizer to subtract a signal portion from the incoming signal based on the control signal to cancel the beat frequency signal of the incoming signal; and at least one analog-to-digital converter operably connected to the at least one adder circuit, the at least one analog-to-digital converter being configured to convert a resulting signal from the at least one adder circuit into a digital signal, wherein the digital signal represents the incoming signal.

16. The reader of claim 15, wherein the sinusoidal estimator is configured to estimate a phase of the beat frequency signal based on the digital signal.

17. The reader of claim 15 further comprising a rectifier operably coupled to the matching circuit, wherein the rectifier is configured to rectify the incoming signal into a rectified signal, wherein the sinusoidal estimator is configured to estimate amplitude and frequency of the beat frequency signal based on the rectified signal.

18. The reader of claim 17, further comprising at least one low-pass filter between the rectifier and the sinusoidal estimator.

19. The reader of claim 15, further comprising at least one second adder circuit connected to the at least one signal synthesizer to add the control signal with one or more outputs from an operation point tracking module.

20. The reader of claim 19, further comprising at least one digital-to-analog converter operably connected to the at least one second adder circuit to convert a signal from the at least one second adder circuit to an analog signal, wherein the at least one digital-to-analog converter is connected to the at least one adder circuit to provide the analog signal to the at least one adder circuit.

* * * * *